US008835848B2

United States Patent
Oh et al.

(10) Patent No.: US 8,835,848 B2
(45) Date of Patent: Sep. 16, 2014

(54) ULTRA-MINIATURIZED ELECTRON OPTICAL MICROCOLUMN

(71) Applicant: Industry-University Cooperation Foundation Sunmoon University, Chungcheongnam-do (KR)

(72) Inventors: Tae Sik Oh, Chungcheongnam-do (KR); Ho Seob Kim, Incheon (KR); Dae Wook Kim, Gyeonggi-do (KR); Seung-Joon Ahn, Daejeon (KR)

(73) Assignee: Industry-University Cooperation Foundation Sunmoon University, Chungcheongnam-Do (KR)

( * ) Notice: Subject to any disclaimer, the term of this patent is extended or adjusted under 35 U.S.C. 154(b) by 0 days.

(21) Appl. No.: 14/180,350

(22) Filed: Feb. 13, 2014

(65) Prior Publication Data

US 2014/0224997 A1    Aug. 14, 2014

(30) Foreign Application Priority Data

Feb. 14, 2013    (KR) ......................... 10-2013-0015832

(51) Int. Cl.
*H01J 29/46* (2006.01)
*H01J 3/36* (2006.01)
*H01J 3/14* (2006.01)
*H01J 3/26* (2006.01)

(52) U.S. Cl.
CPC .... *H01J 3/26* (2013.01); *H01J 3/14* (2013.01)
USPC ......................... 250/311; 250/310; 250/492.3

(58) Field of Classification Search
USPC ............. 250/306, 307, 309, 310, 311, 396 R, 250/396 ML, 402.1, 492.3, 526
See application file for complete search history.

(56) References Cited

U.S. PATENT DOCUMENTS

| 6,077,417 | A  | * | 6/2000  | Lee et al. | 205/769 |
| 6,475,326 | B2 | * | 11/2002 | Gross | 156/272.2 |
| 6,972,154 | B2 | * | 12/2005 | Gross | 428/432 |
| 7,081,630 | B2 | * | 7/2006  | Saini et al. | 250/398 |
| 7,279,686 | B2 | * | 10/2007 | Schneiker | 250/396 R |
| 7,329,878 | B2 | * | 2/2008  | Kim | 250/396 R |
| 8,173,978 | B2 | * | 5/2012  | Kim et al. | 250/492.22 |

FOREIGN PATENT DOCUMENTS

| JP | H10-92361 A | 4/1998 |
| WO | 97/44848 A1 | 11/1997 |

* cited by examiner

*Primary Examiner* — Bernard E Souw
(74) *Attorney, Agent, or Firm* — The PL Law Group, PLLC

(57) ABSTRACT

An ultra-miniaturized electron optical microcolumn is provided. The electron optical microcolumn includes an electron-emitting source emitting electrons using a field emission principle, an extraction electrode causing the emission of electrons from the electron-emitting source, a focusing electrode to which voltage is flexibly applied in response to a working distance to a target for regulating a focusing force of electron beams emitted from the electron-emitting source, an acceleration electrode accelerating electrons emitted by the extraction electrode, a limit electrode regulating an amount and a size of electron beams using electrons accelerated by the acceleration electrode, and a deflector deflecting electron beams towards the target.

20 Claims, 8 Drawing Sheets

ULTRA-MINIATURIZED ELECTRON OPTICAL MICROCOLUMN

CROSS-REFERENCE TO RELATED APPLICATIONS

This application claims priority to Korean Patent Application No. 10-2013-0015832 filed on Feb. 14, 2013 in the Korean Intellectual Property Office (KIPO), the entire contents of which are hereby incorporated in their entirety by reference.

BACKGROUND

1. Field of the Invention

The present invention relates, in general, to an ultra-miniaturized electron optical microcolumn and, more particularly, to a ultra-miniaturized electron optical microcolumn which is able to be manufactured into a compact size and optimize the trajectory of an electron beam.

2. Description of the Related Art

Generally, although manufacturing apparatuses and inspection apparatuses using an electron beam, which are used in semiconductor and display industries, have very high resolution compared to existing optical equipment, the size of an electron column for generating and controlling an electron beam is bulky. Thus, the electron column using an electron beam has a large acceleration voltage ranging from a few kV to tens of kV, as well as a large size, possibly causing defects to samples or structures of a substrate. Further, the electron column has a low processing speed and thus low productivity, so that the electron column is limited to use as a manufacturing device for a mask for a semiconductor, an inspection device for a thin film transistor (TFT) substrate for a display, or the like.

To solve this problem, developed has been a miniaturized electron optical microcolumn, which is generally called a 'micro-column or microcolumn'. The microcolumn can be miniaturized into a compact size of a few~tens mm in length, so that a plurality of miniaturized electron optical microcolumns can be arranged in a single unit, thereby maximizing the operation performance of the unit. Further, since the acceleration voltage of an electron beam can be set to 1 kV or less, minimizing the possibility of damage to structures of a substrate or a sample can be ensured.

However, such a miniaturized electron column has problems that it has reduced resolution compared to the bulky electron column, due to its simple structure and low acceleration voltage, and that, in a case where a probe current to a target surface decreases, it is difficult to detect secondary electrons generated from the target surface when the target surface is scanned at high speed with an electron beam in order to increase resolution. Therefore, further research is required to solve these problems. Further, in a case where a plurality of miniaturized electron columns are arranged in order to improve the operation performance of an assembly of the electron columns, it is difficult to precisely align the electron columns together, thereby requiring further research to develop a structure for the integration of a multiplicity of electron optical columns in a single silicon substrate.

Korean Patent laid-open Publication No. 10-2003-0073598 discloses a conventional microminiaturized electron column, which includes a source lens which is composed of an extraction grid (extractor or extraction electrode) for extracting electrons, an anode grid (accelerator or acceleration electrode) for accelerating electrons, and a limit grid (limiter or limiting electrode) for limiting the size of a electron beam, octupole electrostatic double deflectors for deflecting electron beams, and a focusing lens which is composed of an einzel lens for focusing electron beams.

Like this, the conventional microminiaturized electron optical column is configured such that it is composed of the source lens and the focusing lens with the octupole electrostatic double deflectors interposed therebetween, so that it is very difficult to precisely align centers of these lenses during assembly. Further, although an error of alignment between the source lens and the focusing lens can be corrected to some extent using the arrangement of the octupole electrostatic double deflectors, in this case, the structure of the assembly becomes complicated as does the application method of drive voltage.

SUMMARY

Accordingly, the present invention has been made keeping in mind the above problems occurring in the related art, and the present invention is intended to propose a ultra-miniaturized electron optical column (referred hereinafter to as an 'electron optical microcolumn') capable of optimizing the trajectory of electron beams and minimizing a diameter of a probe.

Another aspect of the present invention is to provide an electron optical microcolumn in which unlike a conventional electron optical column, a focusing electrode is disposed between an extraction grid (extractor or extraction electrode) and an anode grid (accelerator or acceleration electrode), thereby minimizing the size thereof.

A further aspect of the present invention is to provide an electron optical microcolumn in which unlike a conventional electron optical column, a focusing electrode is disposed between an extraction grid and an anode grid so that electron beams can be exactly focused on the surface of a target, thereby improving resolution.

In order to achieve the above aspect, according to one aspect of the present invention, there is provided an electron optical microcolumn including: an electron-emitting source emitting electrons using a field emission principle; an extraction electrode causing the emission of electrons from the electron-emitting source; a focusing electrode to which voltage is flexibly applied in response to a working distance to a target for regulating a focusing force of electron beams emitted from the electron-emitting source; an acceleration electrode accelerating electrons emitted by the extraction electrode; a limit electrode regulating an amount and a size of electron beams accelerated by the acceleration electrode; and a deflector deflecting electron beams towards the target.

The focusing electrode may be disposed between the extraction electrode and the acceleration electrode.

The focusing electrode may have a beam-passing aperture whose diameter is equal to or larger than that of another beam-passing aperture of the extraction electrode.

The focusing electrode may be disposed at a position ranging from 100 μm to 500 μm from the extraction electrode and the acceleration electrode.

The working distance may be a distance from an exit of the deflector and the target.

The limit electrode may have a beam-passing aperture whose diameter is smaller than that of a beam-passing aperture of the extraction electrode.

The deflector may be disposed between the limit electrode and the target.

The deflector may be a quadrupole electrostatic deflector or an octupole electrostatic deflector.

According to the electron optical microcolumn, in spite of a compact structure, the electron optical column can optimize the trajectory of an electron beam and therefore minimize a probe diameter.

Further, with the configuration in which the focusing electrode is disposed between the extraction electrode and the acceleration electrode, unlike the conventional focusing lens, the structure can be made compact, thereby improving assembly precision of a product. Thus, alignment error of electron optical lenses generated during the fabrication of an electron optical column can be minimized, improving focusing performance of an electron beam.

Further, with the configuration in which the focusing electrode is disposed between the extraction electrode and the acceleration electrode, unlike the conventional focusing lens, an electron beam can be exactly focused on the surface of a target, improving resolution, securing a sufficient probe current and ensuring high-speed scanning of an electron beam.

Further, with the configuration in which the beam-passing aperture of the extraction electrode is formed into a relatively large size, a tip and a beam-passing aperture of the extraction electrode can be easily aligned. Thus, a separate scanner or aligning device for position alignment is not required, ensuring easy fabrication.

Furthermore, the present invention enables a conventional microminiaturized electron optical column structure to be made into a compact structure in which a plurality of electrodes for constituting an electron optical column are arranged in a single silicon substrate, facilitating the formation of a ultra-miniaturized electron optical column.

BRIEF DESCRIPTION OF THE DRAWINGS

The above and other aspects, features and advantages of the present invention will be more clearly understood from the following detailed description when taken in conjunction with the accompanying drawings, in which.

DETAILED DESCRIPTION OF THE INVENTION

Figure 1:
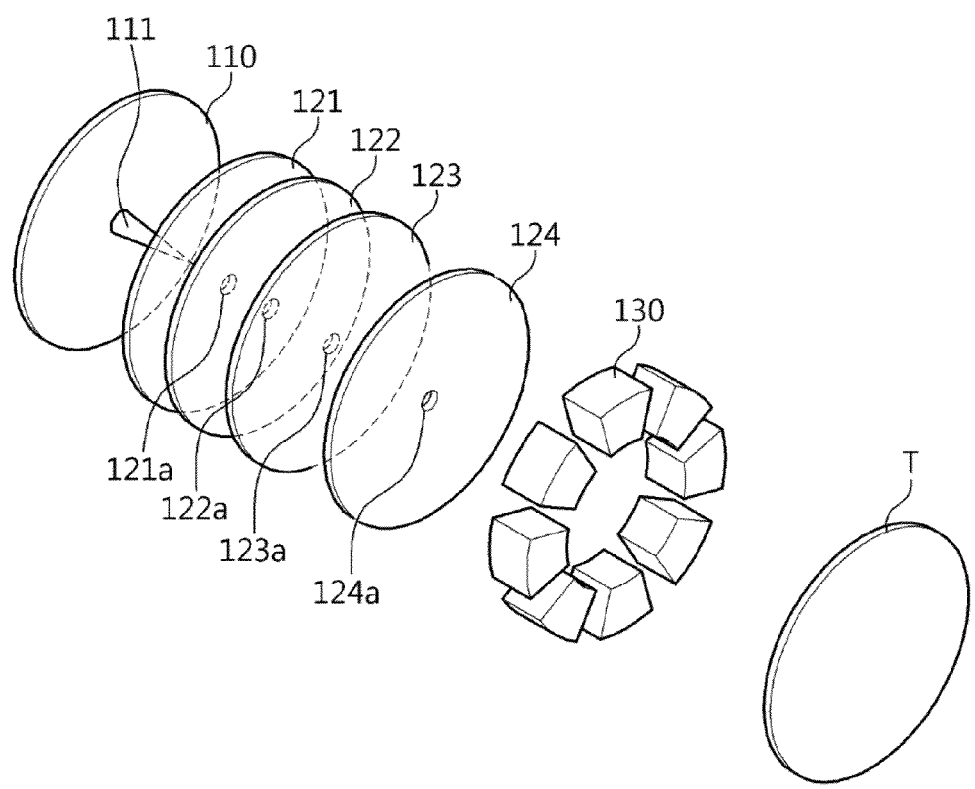
FIG. 1 is a perspective view showing a configuration of an ultra-miniaturized electron optical column (referred hereinafter to as an 'electron optical microcolumn') according to an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts. In the following description, it is to be noted that, when the functions of conventional elements and the detailed description of elements related with the present invention may make the gist of the present invention unclear, a detailed description of those elements will be omitted.

A description will now be made in detail of an exemplary electron optical column (referred hereinafter to as an 'electron optical microcolumn') according to an embodiment of the present invention with reference to the accompanying drawings.

FIG. 1 is a perspective view showing a configuration of an electron optical microcolumn according to an embodiment of the present invention.

Referring to FIG. 1, the ultra-miniaturized electron optical column 100 includes an electron-emitting source 110, an extraction electrode 121, a focusing electrode 122, an acceleration electrode 123, a limit electrode 124, and a deflector 130.

The electron-emitting source 110 emits electrons through a tip 111 using an electron emission principle. Driving voltage of the electron-emitting source 110 ranges from minus hundreds of volts to minus 1 kilo-volt. The electron-emitting source 110 may be composed of W, Mo, HfC, Si, carbon nanotubes, grapheme, or the like.

The extraction electrode 121 causes electron emission from the electron-emitting source 110. The extraction electrode 121 may have a central beam-passing aperture 121a through which an electron beam emitted from the electron-emitting source 110 passes. Here, a diameter of the beam-passing aperture 121a is enlarged ten times or more compared to the related art, thereby amounting to about 50 µm. A voltage of 0 V to minus hundreds of V is applied to the extraction electrode 121. According to the voltage applied to the extraction electrode 121, an amount of emission current emitted from the electron-emitting source 110 is regulated.

The focusing electrode 122 regulates a focusing force of an electron beam that is emitted from the electron-emitting source 110 and passes through the beam-passing aperture 121 of the extraction electrode 121. To this end, voltage is flexibly applied to the focusing electrode 122 according to a working distance which means a distance from an exit of the deflector 130 to a target T. That is, a voltage of 0V to minus hundreds of V is flexibly applied to the focusing electrode 122 according to an electrode voltage applied to the electron-emitting source 110, so as to optimize a focusing angle and a size of an electron beam that passes through the beam-passing apertures 123a and 124a of the accelerating electrode 123 and the limit electrode 124. This optimizes the trajectory of an electron beam passing through the deflector 130, thereby forming an electron beam having a minimum spot size at the surface of a sample, i.e. at a target T.

The focusing electrode 122 may have a central beam-passing aperture 122a through which an electron beam emitted from the electron-emitting source 110. Here, a diameter of the beam-passing aperture 122a may be equal to or larger than a diameter of the beam-passing aperture 121a of the extraction electrode 121 in order for easy alignment with the extraction electrode 121. The focusing electrode 122 is disposed between the extraction electrode 121 and the acceleration electrode 123. The focusing electrode 122 may be positioned within 100 µm to 500 µm from the extraction electrode 121 for effective regulation of an electron beam. Further, the focusing electrode 122 may also be positioned within 100 µm to 500 µm from the acceleration electrode 123 for effective regulation of an electron beam.

The acceleration electrode 123 accelerates electrons emitted from the extraction electrode 121. The acceleration electrode 123 may have a central beam-passing aperture 123a through which an electron beam emitted from the electron-emitting source 110 passes.

The limit electrode 124 regulates an amount and a size of an electron beam accelerated by the acceleration electrode 123. The limit electrode 124 may have a central beam-passing aperture 124a through which an electron beam emitted from the electron-emitting source 110 passes. A diameter of the beam-passing aperture 124a of the limit electrode may be formed to be smaller than a diameter of the beam-passing aperture 121a of the extraction electrode in order to restrict a spot size of an electron beam from being enlarged. A ground voltage (0 V) may be applied to the limit electrode 124.

The deflector 130 scans an electron beam that has passed through the limit electrode 124. The deflector may be composed of quadrupole electrostatic deflection elements or octupole electrostatic deflection elements.

In such an electron optical microcolumn having the above-mentioned configuration, an overall length from the inlet of the extraction electrode 121 to the exit of the deflector 130 is about 2000 μm. However in such a conventional electron optical microcolumn having a focus lens between a deflector and a target, the length from the inlet of the extraction electrode 121 to the exit of the last electrode element in a focusing lens is about 3500 μm. Therefore the structure of the electron optical microcolumn according to the present invention can be miniaturized to up to about 51.7% from the size of the conventional electron optical column.

Figure 2:
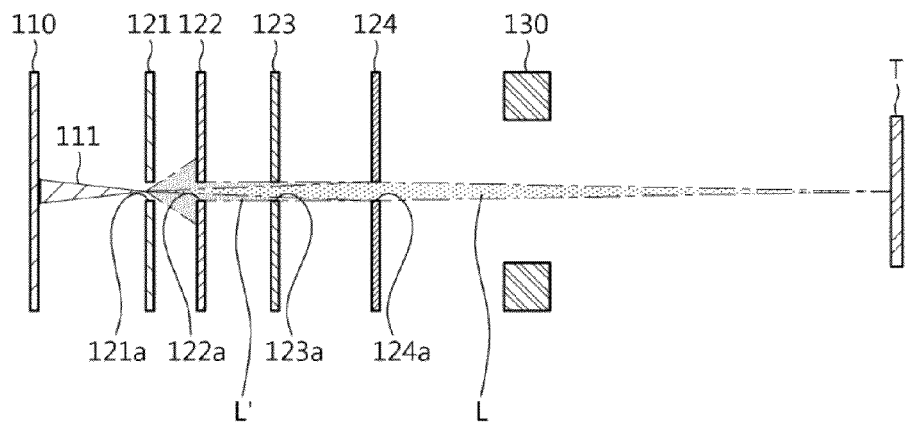
FIG. 2 is a view showing the trajectory of an electron beam in the electron optical microcolumn.

FIG. 2 is a view showing the trajectory of an electron beam in the ultra-miniaturized electron optical microcolumn of the present invention.

Referring to FIG. 2, the trajectory of an electron beam (L) in the ultra-miniaturized electron optical microcolumn 100 is shown. Specifically, an electron beam (L) is first emitted from a tip 111 of the electron-emitting source 110 by field electron emission that is induced by a strong electric field created between the extraction electrode 121 and the tip 111. The focusing electrode 122 regulates a focusing force of the electron beam (L) that has passed through the beam-passing aperture 121a of the extraction electrode 121. Here, voltage is flexibly applied to the focusing electrode 122 in response to a working distance to a target, thereby regulating the focusing force of the electron beam (L). Then, the acceleration electrode 123 accelerates electrons of the electron beam (L) passing through the beam-passing aperture 122a of the focusing electrode. Then, the limit electrode 124 limits an amount and a size of the electron beam (L) that has passed through the beam-passing aperture 123a of the acceleration electrode to predetermined values. The deflector 130 deflects the electron beam (L) that has passed through the limit electrode 124 to allow the electron beam to be scanned onto the target. Here, unexplained reference sign 'L'' denotes the trajectory of an electron beam that, although emitted from the electron-emitting source 110, has not passed through the beam-passing apertures 121a, 122a, 123a, and 124a, due to limited diameters thereof.

Figure 3:
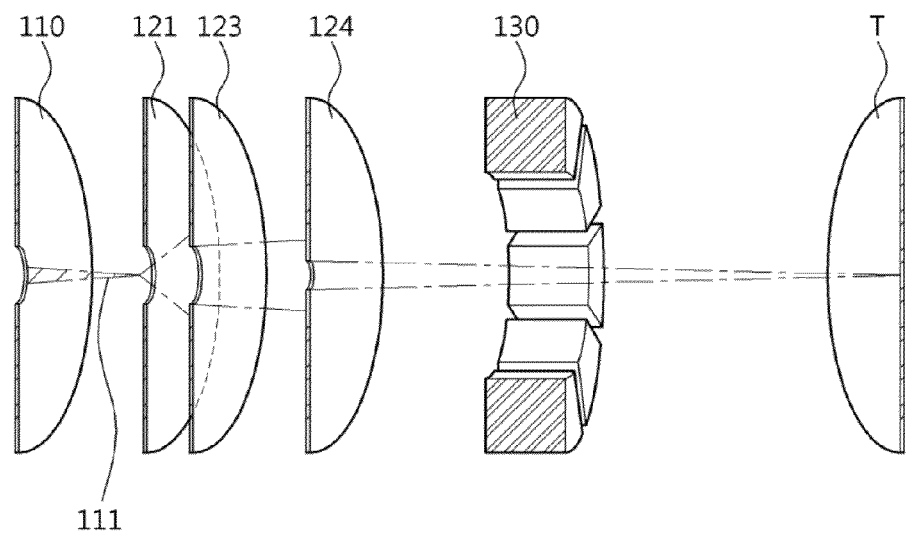
FIGS. 3 and 4 are views showing trajectories of an electron beam in the electron optical microcolumn according to whether or not a focusing electrode has been provided.
Figure 4:
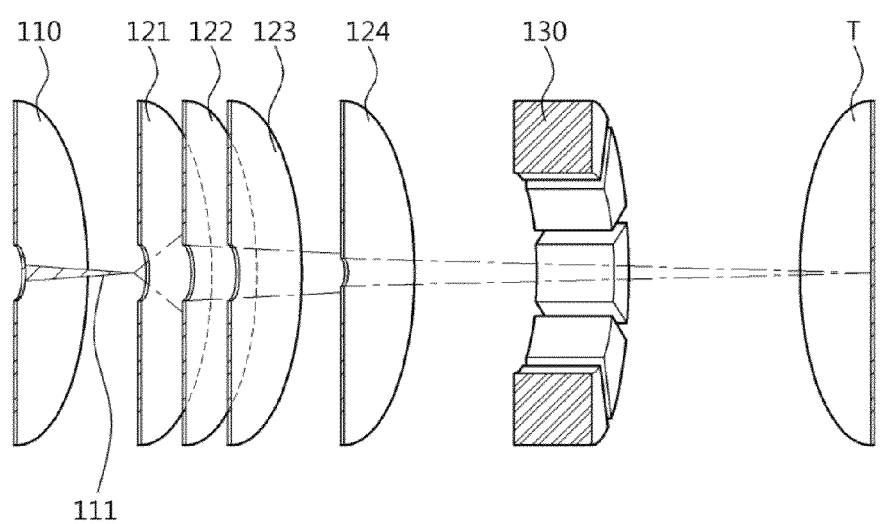

FIGS. 3 and 4 are views showing trajectories of an electron beam in the ultra-miniaturized electron optical microcolumn according to whether or not a focusing electrode has been provided. FIG. 3 shows the configuration in which the focusing electrode 122 is not provided in the electron optical microcolumn, and FIG. 4 shows the configuration in which the focusing electrode 122 is provided.

Referring to FIGS. 3 and 4, in the case of the focusing electrode 122-free configuration of FIG. 3, when a voltage of minus 920 V or more is applied to the acceleration electrode 123 in conditions of a voltage of a tip of 1 kV and a working distance of 2 mm, an electron beam having a probe diameter of tens of nm can be focused. However, in the case of the focusing electrode 122—provided configuration of FIG. 4, when the trajectory of an electron beam passing through the beam-passing aperture of the limit electrode 124 is optimized while 0 V and −870 V are applied to the acceleration electrode 123 and the focusing electrode 122, respectively, an electron beam having a high current density probe diameter that is considerably reduced to a level of a few nm can be focused.

Figure 5:
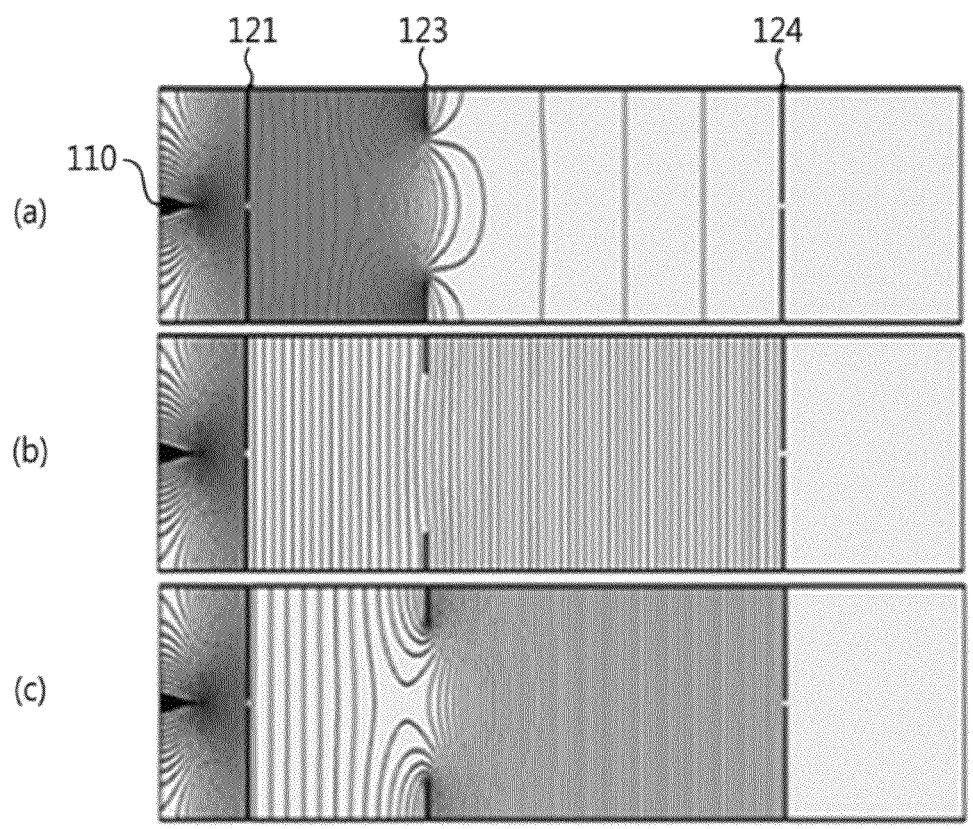
FIGS. 5 to 7 are views showing distributions of equipotential lines in the electron optical microcolumn, which vary according to whether or not the focusing electrode has been provided.
Figure 6:
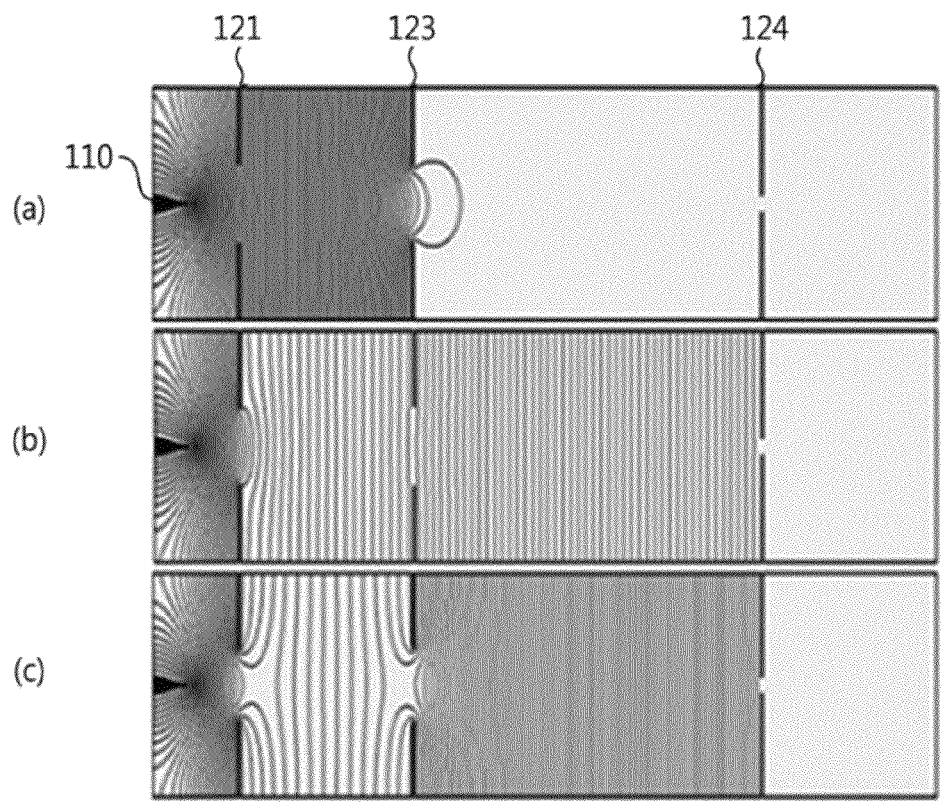
Figure 7:
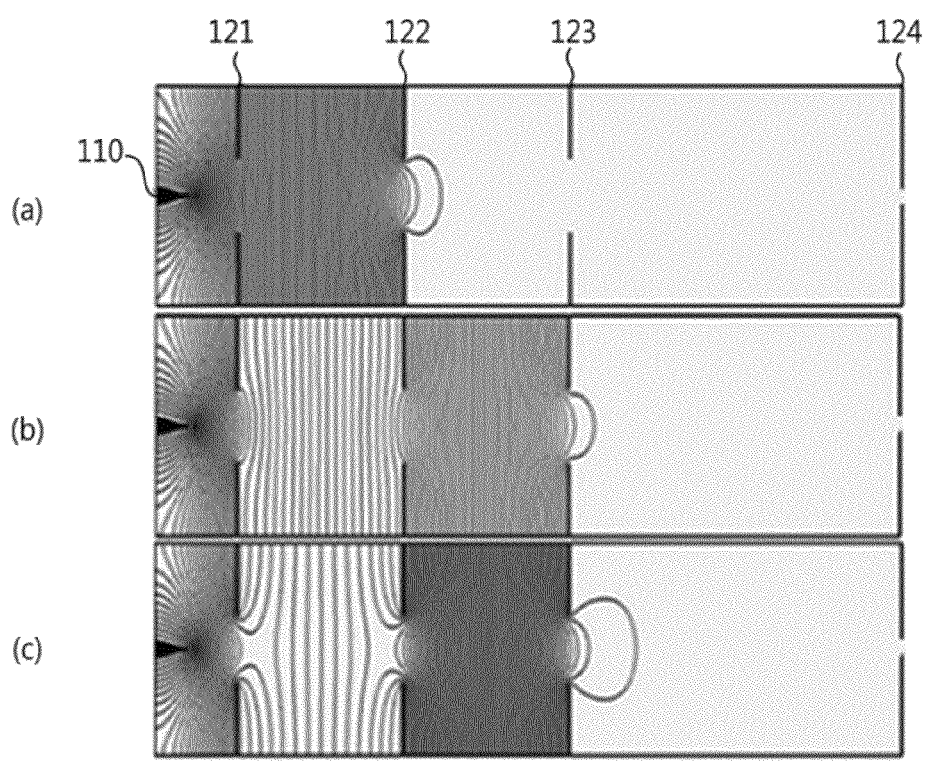

FIGS. 5 to 7 are views showing distributions of equipotential lines in the ultra-miniaturized electron optical microcolumn, which vary according to whether or not the focusing electrode has been provided.

FIGS. 5 to 7 show the distribution of equipotential lines in order to compare a difference in design according to whether or not the focusing electrode 122 is provided.

FIG. 5 shows distribution of equipotential lines in a source lens of a conventional miniaturized electron optical column having no focusing electrode 122, in which diameters of the beam-passing apertures of the extraction electrode 121, the acceleration electrode 123, and the limit electrode 124 are different from each other. That is, in the source lens shown in FIG. 5, diameters of beam-passing apertures 121a, 123a, and 124a of the extraction electrode 121, the acceleration electrode 123, and the limit electrode 124 are 5 μm, 100 μm, and 2.5 μm, respectively. Further, distances between the extraction electrode 121 and the acceleration electrode 123 and between the acceleration electrode 123 and the limit electrode 124 are about 200 μm and about 400 μm, respectively.

FIG. 6 shows distribution of equipotential lines in a source lens of a conventional miniaturized electron optical microcolumn having no focusing electrode 122 like in FIG. 5, in which, however, diameters of the beam-passing apertures of the extraction electrode 121 and the acceleration electrode 123 are the same each other. That is, in the source lens shown in FIG. 6, diameters of beam-passing apertures 121a and 123a of the extraction electrode 121 and the acceleration electrode 123 are 50 μm, respectively, and the diameter of the beam-passing aperture 124a of the limit electrode 124 is 2.5 μm.

FIG. 7 shows distribution of equipotential lines in a source lens of a miniaturized electron optical microcolumn according to the present invention having a focusing electrode 122, in which the beam-passing apertures of the extraction electrode 121, the focusing electrode 122, and the limit electrode 124 have the same diameters of 50 μm, and distances between the extraction electrode 121 and the focusing electrode 122 and between the focusing electrode 122 and the acceleration electrode 123 have the same distances of about 200 μm.

In the ultra-miniaturized electron optical microcolumn shown in FIGS. 5 to 7, −1 kV, −700 V, and 0 V were applied to the electron-emitting source 110, the extraction electrode 121, and the limit electrode 124, respectively. Further, (a) 0 V, (b) −500 V, and (c) −850 V were respectively applied to the acceleration electrode 123 shown in FIGS. 5 and 6. Further, (a) 0 V, (b) −500 V, and (c) −850 V were respectively applied to the focusing electrode 122 shown in FIG. 7. It could be known through FIGS. 5 to 7 that distribution of equipotential lines varies according to the provision of the focusing electrode 122, so that electron lenses operate differently.

Figure 8:
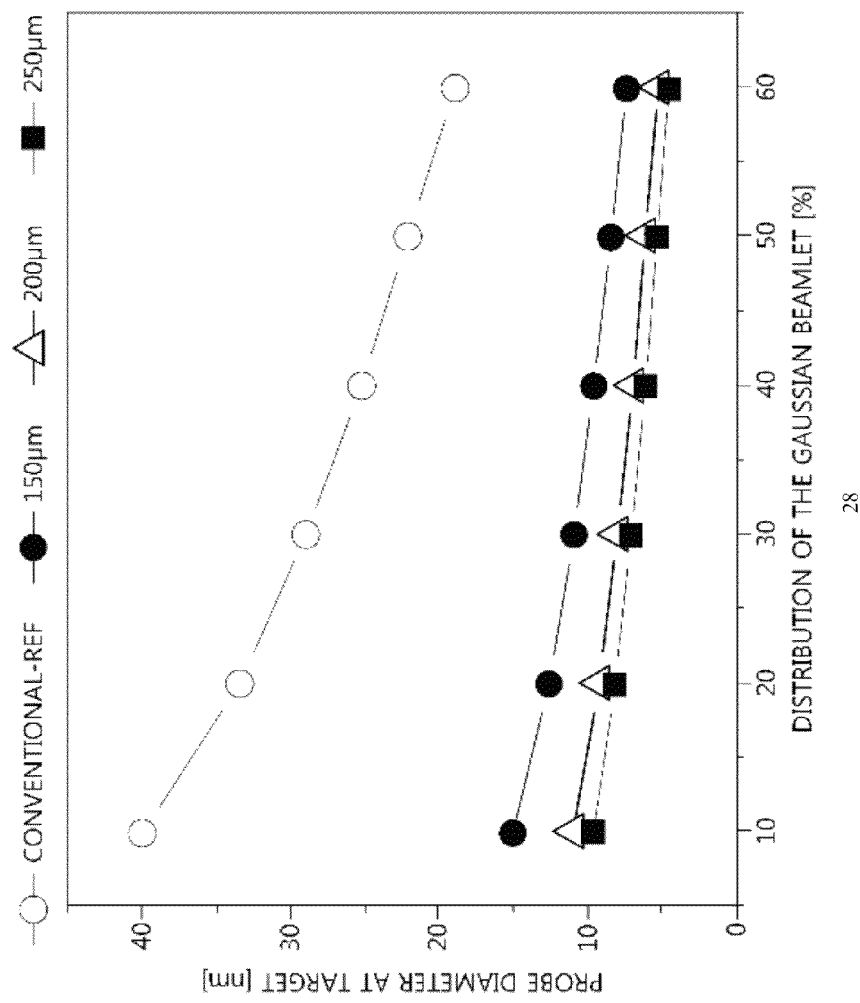
FIG. 8 is a graph showing probe diameters of an electron beam at a target according to the electron optical microcolumn and a conventional electron optical column.

FIG. 8 is a graph showing probe diameters of an electron beam at a target according to the ultra-miniaturized electron optical microcolumn whose electrodes have the same diameters of beam-passing apertures as the ultra-miniaturized electron optical microcolumn of FIG. 7 and a conventional electron optical column.

Referring to FIG. 8, open circles represent the simulated results reported in Reference Document 1 (J. Vac. Sci. Technol. B. Vol. 7, No. 6, (1989) pp. 1855) and Reference Document 2 (J. Vac. Sci. Technol. B. Vol. 8, No. 6, (1990) pp.

1698), solid circles represent the case where the focusing electrode 122 is located at a position of 150 μm from the extraction electrode 121 in the structure of the present invention, open triangles represent the case where the focusing electrode 122 is located at a position of 200 μm from the extraction electrode 121 in the structure of the present invention, and solid squares represent the case where the focusing electrode 122 is located at a position of 250 μm from the extraction electrode 121 in the structure of the present invention. Like this, according to the present invention, although the beam-passing aperture 121*a* of the extraction electrode 121 has been enlarged, it is possible to realize a probe diameter of 10 nm or less, thereby obtaining considerably improved results compared to the conventional structure.

That is to say, since a probe diameter of 10 nm or less can be obtained despite removing the focusing lens as well as enlarging the beam-passing aperture of the extraction electrode, the present invention provides outstanding effects compared to the conventional structure.

Figure 9:
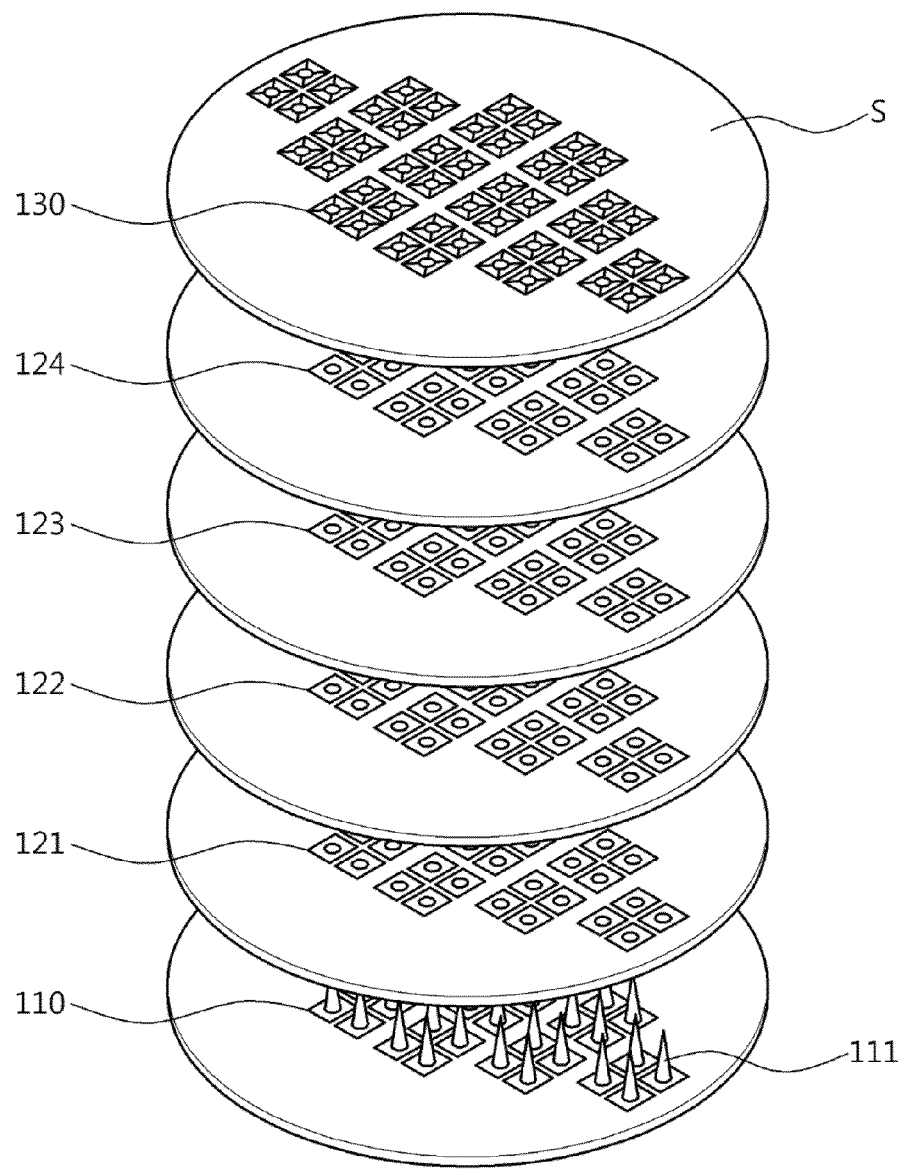
FIG. 9 is a perspective view showing a configuration of a Si wafer-scale multiple-electron optical microcolumn according to an embodiment of the present invention.

FIG. 9 is a perspective view showing a configuration of a Si wafer-scale multiple-electron optical microcolumn according to an embodiment of the present invention.

Referring to FIG. 9, the Si wafer-scale multiple-electron optical microcolumn may be fabricated by forming an electron-emitting source 100, an extraction electrode 121, a focusing electrode 122, an acceleration electrode 123, a limit electrode 124, and a deflector 130 on a single Si wafer substrate using a micro electro mechanical system (MEMS) and sequentially assembling the resulting Si wafer substrates, thereby forming an electron optical microcolumn assembly.

The compact structure of the present invention facilitates easy fabrication of a multiplicity of electron optical microcolumns, compared to the conventional structure.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An electron optical microcolumn comprising:
   an electron-emitting source emitting electrons using a field emission principle;
   an extraction electrode causing the emission of electrons from the electron-emitting source;
   a focusing electrode to which voltage is flexibly applied in response to a working distance to a target for regulating a focusing force of electron beams emitted from the electron-emitting source;
   an acceleration electrode accelerating electrons emitted by the extraction electrode;
   a limit electrode regulating an amount and a size of electron beams using electrons accelerated by the acceleration electrode; and
   a deflector deflecting electron beams towards the target;
   wherein the focusing electrode is disposed between the extraction electrode and the acceleration electrode.

2. The electron optical microcolumn according to claim 1, wherein the focusing electrode has a beam-passing aperture whose diameter is equal to or larger than that of another beam-passing aperture of the extraction electrode.

3. The electron optical microcolumn according to claim 1, wherein the focusing electrode is disposed at a position ranging from 100 μm to 500 μm from the extraction electrode and the acceleration electrode.

4. The electron optical microcolumn according to claim 1, wherein the limit electrode has a beam-passing aperture whose diameter is smaller than that of a beam-passing aperture of the extraction electrode.

5. The electron optical microcolumn according to claim 1, wherein the deflector is disposed between the limit electrode and the target.

6. The electron optical microcolumn according to claim 1, wherein the deflector is a quadrupole electrostatic deflector or an octupole electrostatic deflector.

7. The electron optical microcolumn according to claim 1, wherein the electron-emitting source, the extraction electrode, the focusing electrode, the acceleration electrode, the limit electrode, and the deflector are formed on a single Si substrate, and a multiplicity of resulting Si substrates are sequentially assembled to form an electron optical microcolumn assembly.

8. The electron optical microcolumn according to claim 2, wherein the focusing electrode is disposed at a position ranging from 100 μm to 500 μm from the extraction electrode and the acceleration electrode.

9. The electron optical microcolumn according to claim 2, wherein the limit electrode has a beam-passing aperture whose diameter is smaller than that of a beam-passing aperture of the extraction electrode.

10. The electron optical microcolumn according to claim 2, wherein the deflector is disposed between the limit electrode and the target.

11. The electron optical microcolumn according to claim 2, wherein the deflector is a quadrupole electrostatic deflector or an octupole electrostatic deflector.

12. The electron optical microcolumn according to claim 2, wherein the electron-emitting source, the extraction electrode, the focusing electrode, the acceleration electrode, the limit electrode, and the deflector are formed on a single Si substrate, and a multiplicity of resulting Si substrates are sequentially assembled to form an electron optical microcolumn assembly.

13. The electron optical microcolumn according to claim 3, wherein the limit electrode has a beam-passing aperture whose diameter is smaller than that of a beam-passing aperture of the extraction electrode.

14. The electron optical microcolumn according to claim 3, wherein the deflector is disposed between the limit electrode and the target.

15. The electron optical microcolumn according to claim 3, wherein the deflector is a quadrupole electrostatic deflector or an octupole electrostatic deflector.

16. The electron optical microcolumn according to claim 3, wherein the electron-emitting source, the extraction electrode, the focusing electrode, the acceleration electrode, the limit electrode, and the deflector are formed on a single Si substrate, and a multiplicity of resulting Si substrates are sequentially assembled to form an electron optical microcolumn assembly.

17. The electron optical microcolumn according to claim 4, wherein the deflector is disposed between the limit electrode and the target.

18. The electron optical microcolumn according to claim 4, wherein the deflector is a quadrupole electrostatic deflector or an octupole electrostatic deflector.

19. The electron optical microcolumn according to claim 4, wherein the electron-emitting source, the extraction electrode, the focusing electrode, the acceleration electrode, the limit electrode, and the deflector are formed on a single Si substrate, and a multiplicity of resulting Si substrates are sequentially assembled to form an electron optical microcolumn assembly.

20. The electron optical microcolumn according to claim 5, wherein the electron-emitting source, the extraction electrode, the focusing electrode, the acceleration electrode, the limit electrode, and the deflector are formed on a single Si substrate, and a multiplicity of resulting Si substrates are sequentially assembled to form an electron optical microcolumn assembly.

* * * * *